United States Patent [19]
Anderson et al.

[11] Patent Number: 6,089,917
[45] Date of Patent: Jul. 18, 2000

[54] METHOD AND SYSTEM FOR CIRCUIT BOARD COMMON MODE NOISE SUPPRESSION UTILIZING FERROUS CORES

[75] Inventors: Neil A. Anderson, Rochester; John L. Colbert, Byron; Michael H. Fisher, Rochester; Randall John Fuhrman, Pine Island; Don Alan Gilliland, Rochester; Mark L. Kyllo, Kasson; Kevin J. Przybylski, Rochester, all of Minn.

[73] Assignee: International Business Machines Corporation, Armonk, N.Y.

[21] Appl. No.: 08/957,526

[22] Filed: Oct. 24, 1997

[51] Int. Cl.[7] .................................................. H01R 33/945
[52] U.S. Cl. ............................................................. 439/620
[58] Field of Search ................................... 439/620, 610, 439/571; 333/12, 185, 182

[56] References Cited

U.S. PATENT DOCUMENTS

| | | | |
|---|---|---|---|
| 4,150,420 | 4/1979 | Berg | 361/401 |
| 5,014,026 | 5/1991 | Wanjura | 333/12 |
| 5,025,211 | 6/1991 | Craft et al. | 333/12 |
| 5,542,860 | 8/1996 | Bandura et al. | 439/571 |
| 5,756,207 | 5/1998 | Clough et al. | 428/375 |

*Primary Examiner*—Paula Bradley
*Assistant Examiner*—Briggitte R Hammond
*Attorney, Agent, or Firm*—Felsman, Bradley, Vaden, Gunter & Dillon, LLP

[57] ABSTRACT

A noise attenuating system for suppressing noise on circuit board transmission lines is provided. A first ferrous member is attached to a first side of the circuit board and a second ferrous member attached to a second side of the circuit board. The second ferrous member is substantially opposed from the first ferrous member, such that conductive transmission lines are contained between the first ferrous member and the second ferrous member. Transmission line interference is absorbed and suppressed by the first ferrous member and the second ferrous member. In a preferred embodiment, substantially all traces which enter and exit the circuit board on a connector pass between the first ferrous member and the second ferrous member. Apertures in the circuit board allow the ferrous members to adjoin forming a ferrous core.

6 Claims, 3 Drawing Sheets

METHOD AND SYSTEM FOR CIRCUIT BOARD COMMON MODE NOISE SUPPRESSION UTILIZING FERROUS CORES

BACKGROUND OF THE INVENTION

1. Technical Field

The present invention relates in general to noise suppression within a computer system and in particular to reducing the distribution of noise within a computer system. Still more particularly, the present invention relates to placement of a ferrous material onto both sides of a printed circuit board to suppress unwanted noise on transmission lines.

2. Description of the Related Art

Controlling electrical interference which results from spurious electrical signals has become critical in the design of computer systems. Ever increasing requirements on the performance of new computer systems have led to widespread utilization of noise filtering techniques. New, low voltage, high frequency logic families produce more noise and are more susceptible to noise than their predecessors. State of the art computer systems are ever increasing in operating frequencies. Consequently, interference due to noise often receives more emphasis and investigation than timing and low power design challenges.

Research and development on computer technology has continually produced smaller and more compact systems. However, the transmission of logic signals and power has not received the same amount of design attention received by other components of computer systems. Transmission line interfacing is a necessary and integral part of computer systems. Many problems arise when long data distribution lines are required to transport low voltage digital signals. As a result of utilization of low voltages and high frequency, a low level noise level can cause unacceptable disruptive interference.

Printed circuit boards are made from sheets of insulative material, such as polyamide, or other insulators usually made from polymer compounds. Generally, a thin layer of copper is attached to a polymer sheet. The thin layer of copper is etched away from the base insulating material to form transmission lines which are not electrically connected to each other. Each isolated transmission line can be called a "trace." Printed circuit board technology is well known and the circuit board manufacturing will not be discussed here in detail.

A single layer printed circuit board, generally, has 2 layers of copper, one on the top side and one on the bottom side. Currently, state of the art circuit boards implementing 64 bit data buses might utilize a 24 layer circuit board. The copper layer generally contains hundreds of traces. This extreme density places a significant amount of electrical noise in close proximity to sensitive circuits.

Advances in printed circuit board technology allow shrinking of the minimum distance between adjacent circuit traces. Advances have led to an increase in the coupling capacitance and mutual inductance from a trace to adjacent or neighboring traces. Due to the increase in the coupling capacitance, an oscillator signal or synchronization clock can adversely affect adjacent circuits. If an adjacent trace is quiet, capacitive coupling induces noise or an unwanted signal into a quiet trace. This has a determinental effect on sensitive circuits and induces failures into the system.

The criticality of noise susceptibility is often dependent on the type of logic circuits utilized in the design. Dynamic logic circuit families and their derivatives have gained wide spread acceptance. However, the voltage required to switch logic gates of dynamic logic circuits is very low. Currently, threshold voltages of transistors are as low as 0.1 volt. Hence, state of the art logic circuits trade noise margin to reduce power consumption and delay.

High frequency, low voltage designs have increased noise susceptibility, and thus require greater utilization of noise attenuation methods. Data failures due to noise are sometimes called noise failure. Noise failures can be more menacing than timing failure problems. This is due to the amorphous form of noise. Often, noise takes no definite form or distinct manifestation. Therefore, discovery of the source and consequently, remedy of the failure can be very difficult to accomplish. For most circuits, timing failure can be recovered by changing the clock speed and thus allowing more time for signal propagation. However, noise failures are caused by many phenomena such as capacitive coupling, input slope, circuit length and logic families. Noise failure is much more difficult to predict and to control, than other phenomena due to the interaction of these phenomena.

Decoupling capacitors are frequently utilized to attenuate noise in circuit board designs. While decoupling capacitors can provide adequate noise filtering at frequencies up to 75 MHz, their performance at high frequencies is dramatically reduced by the presence of circuit resonances. Circuit resonance can arise from the interaction of the decoupling capacitors and stray inductance. Many engineers have observed and labored over noise problems that arise unexpectedly from unique combinations of noise frequencies, PC board layouts and decoupling capacitors.

Commercial electrical products are required to pass mandatory United States and International electronic emission requirements in order to be sold in these respective markets. High frequency noise is often produced on, and conducted through a printed circuit board's power and data distribution bus to the external environment. A manufacturer must control electronic emissions to pass government requirements. Examples of devices which are required to pass governmental regulations are computers, AC adapters, facsimile devices, printers, and other communication devices.

Internal and external cable assemblies or transmission lines in computer equipment often act as miniature antennas and radiate noise into the environment. Voltages and noise currents transform into radiated electronic emissions when conducted through transmission lines.

Circuits frequently radiate electronic noise which originates from data bus switching and clock signals. Most oscillators or clocks operate at a determined frequency. When a transmission line reaches a fraction of the wavelength of the oscillation frequency, the transmission line acts as an antenna. Likewise, a susceptible circuit having a short length can become a receiving antenna. For instance, a frequency of 1 GHz has a wavelength of approximately 1 foot. A half wave antenna which would very efficiently absorb or induce a 1 GHz noise signal would be only 6 inches long. Many power lines and data lines are 6 to 12 inches long. Radiating noise commonly interferes with low voltage logic circuits which utilize transmission lines of short distances. This is particularly true when coupling occurs because transmission lines are a fraction of a wave length of a spurious radiation frequency. Transmission lines are present in every chip, every circuit board and virtually everywhere in a computer system.

Higher circuit board trace densities are required for larger data buses. Common mode noise failures have become prevalent in today's circuits. Common mode currents are currents which flow on more than one transmission line in the same direction. Emissions emanating from a product in the form of common mode current can create interference problems for other circuits and also cause failure of government emission requirements. For typical emission problems, common mode current flows on ground, signals, and voltage planes from a source, such as an oscillator, towards a connector which provides the input/output to the circuit board or the system.

Many computer noise suppression techniques place a ferrous core material on cables and conductors. Cables might have ferrite beads placed over individual wires or entire cables. Alternatively, ferrite material is some times placed over flat ribbon cable assemblies. Cabling requirements utilizing ferrous beads are costly. Assembly of cables is normally done by outside contractors who specialize in wire harnesses. Utilizing outside contractors and vendors requires purchasing effort, quality control, inspection and additional part numbers. Placement of ferrous beads or cores on cables requires special handling so the cores are not broken during shipping and handling. All of the foregoing tasks add to the assembly costs of computer systems, and in particular add to the final cost of a computer system.

Cabling with magnetic cores requires detailed cable routing. Strain reliefs must be utilized at frequent intervals. Ferrous material is heavy, therefore, vibration and gravity can fatigue cable insulation and pull on crimped or soldered connections. Continuous flexing of a cable at the edge of the ferrous material can strain harden the copper wires and eventually cause an open circuit. Additionally, cables can unplug due to the force of the ferrous core pulling on the connection during shipping or vibration.

Brittleness and vulnerability of ferrous cores to physical shock are inherent characteristics of ferrous. Most ferrous cores are placed in equipment that is subject to the shock and vibration of shipping, handling, and the installation processes. Ferrous material assembled to cables can move and potentially break when impacted by a hard object. When installed on flexible cable harnesses, ferrous cores of significant mass must be encapsulated by heat shrink tubing or otherwise protected and secured in place, also adding to the overall cost. Heavy ferrous cores attached to cables cause a multiplicity of difficulties.

Hence, there is a need for a low cost, high density, reliable power and data transmission system with suppressed noise, and in particular, common mode noise. Additionally, there is a need for economical mounting of ferrous cores in a computer system such that the ferrous cores are sufficiently retained to reduce construction costs and eliminate fatigue concerns. The present invention is directed at reducing the cost and increasing the reliability of a computer system and while providing noise suppression at the source of undesirable emissions.

SUMMARY OF THE INVENTION

It is therefore one object of the present invention to provide reliable cost effective noise reduction in a computer system.

It is another object of the present invention to provide a reliable and cost effective noise filtering system for circuit cards and circuit card ports.

It is yet another object of the present invention to provide filtering for transmission lines within a circuit card to suppress emissions as close as possible to the source of emission.

The foregoing objects are achieved as is now described. A noise attenuating system for suppressing noise on circuit board transmission lines is provided. A first ferrous member is attached to a first side of the circuit board and a second ferrous member attached to a second side of the circuit board. The second ferrous member is substantially opposed from the first ferrous member, such that conductive transmission lines are contained between the first ferrous member and the second ferrous member. Transmission line interference is absorbed and suppressed by the first ferrous member and the second ferrous member. In a preferred embodiment, substantially all traces which enter and exit the circuit board on a connector pass between the first ferrous member and the second ferrous member. Apertures in the circuit board allow the ferrous members to adjoin forming a ferrous core.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 1:
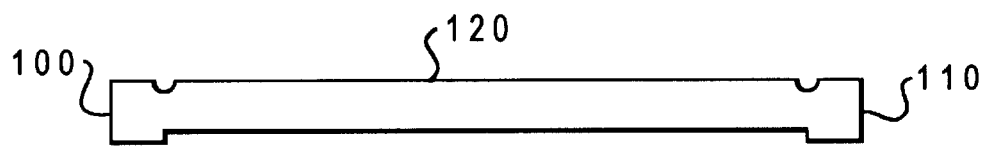
FIG. 1 illustrates a ferrous material which constitutes one half of a split ferrous core in accordance with the present invention.
Figure 2:
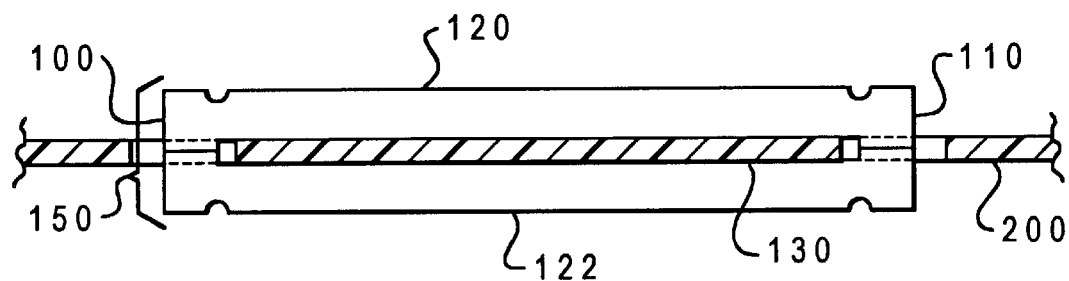
FIG. 2 illustrates the positioning of two ferrous members to form a ferrous core in accordance with the present invention.

With reference now to the figures and in particular with reference to FIG. 1, a ferrous member 120 which constitutes one half of a split ferrous core is depicted. Ferrous member 120 is thicker at ends 100 and 110 than it is at its center. Referring to FIG. 2, identical ferrous members 120 and 122 are stacked and rotated 180° from each other to form ferrous core 150. In this detailed description, elements of the invention which are illustrated in multiple drawings are identified by identical call out number. For example, ferrous member 120 is illustrated in FIG. 1 and in FIG. 2. Referring to FIG. 2, the additional thickness at ends 100 and 110 of ferrous member 120 provide area 130 for transmission lines of circuit board 200 to pass through. A portion of circuit board 200 is depicted in area 130 between ferrous member 120 and ferrous member 122. Additional thickness at ends 100 and 110 allow ferrous member 120 to protrude half way through circuit board 200. The length of ferrous member 120 is such that a significant quantity of traces on circuit board 200 can be placed in area 130.

Figure 5:
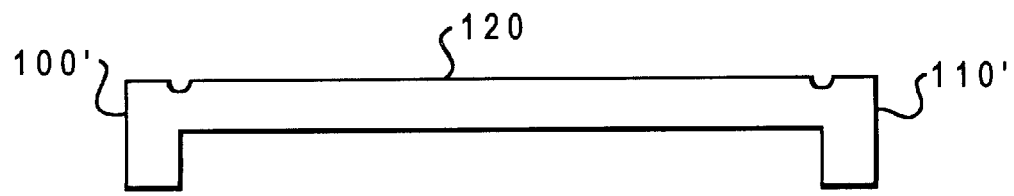
FIG. 5 illustrates an alternate embodiment of the ferrous member.

An additional embodiment as illustrated in FIG. 5, would have ferrous member 120' with additional thickness at ends 100' and 110'. In this embodiment, the additional thickness would be greater than the thickness of circuit board 200 to allow ferrous member 120 to protrude through circuit board 200 and exit the opposite side. Therefore, the second ferrous member 122 could be a standard rectangle shape and the basic shape of ferrous core 150 would not change.

Figure 3:
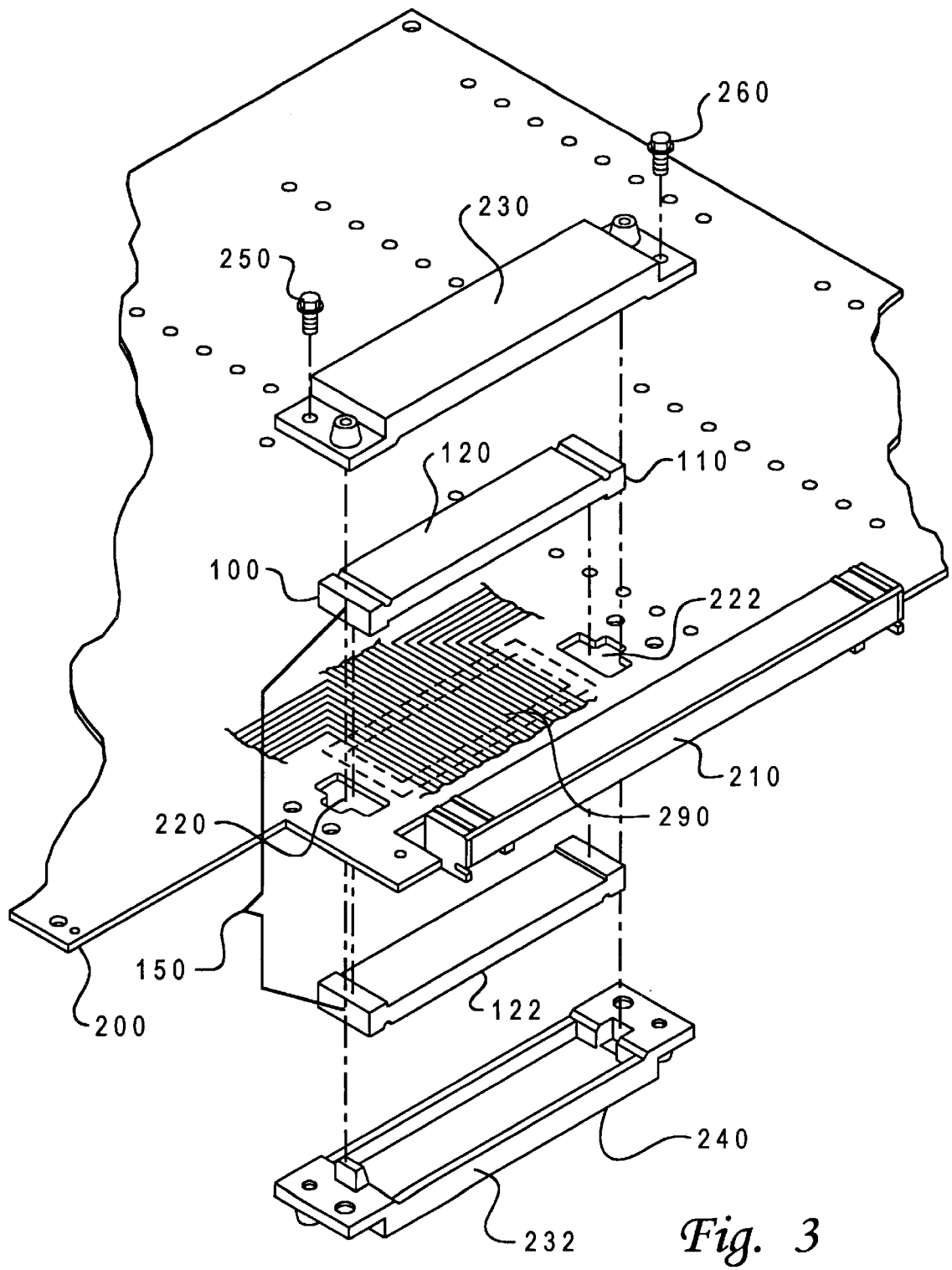
FIG. 3 depicts mounting of a split ferrous core onto a printed circuit board in accordance with the present invention.

Referring to FIG. 3, ferrous members 120 and 122 are depicted in assembly. Ferrous members 120 and 122 are assembled on circuit board 200 to suppress unwanted noise, such as common mode current, on data transmission lines and power transmission lines. Data transmission lines and power transmission lines are depicted in circuit board region 290 which is bound by dashed lines on circuit board 200. Circuit board region 290 is a three dimensional area or volume that intersects circuit board 200 adjacent to connector 210.

In a preferred embodiment, ferrous members 120 and 122 are made from a ferrite material. A ferrite is a class of ceramic ferromagnetic material that can be magnetized to produce large magnetic flux densities in response to small applied magnetization forces. The small applied magnetization force is provided by a current flow in the traces in circuit board region 290 when ferrous core 150 is fully assembled to circuit board 200. Ferrite material can be utilized to replace laminated cores or slug iron core material and ferrite material is particularly effective in the present invention. Ferrite material is utilized in the present invention to filter frequencies above 100 kilohertz (kHz).

In general, ferrites are very effective for interference filtering of frequencies above 30 MHz. The precise filtering properties of ferrous core 150 are dependent on the composition of ferrous core 150. A preferred embodiment utilizes a composition of iron, nickel and zinc oxides to provide a high volume resistivity of approximately 10 ohm-cm and a moderate permeability of 100 to 1500.

The unique high frequency noise suppression performance of ferrous core 150 is a result of ferrous core's 150 frequency dependent complex impedance. At low frequencies, below 10 MHz, ferrous core 150 presents a small, predominately inductive impedance of 10 ohms or less. At higher frequencies, the impedance of ferrous core 150 increases to over 100 ohms, and becomes essentially resistive above 100 MHz.

Ferrous core 150 provides resistive loss to attenuate and dissipate high frequency noise as minute quantities of heat. However, for proper operation desirable signals traveling on data transmission lines cannot be attenuated by ferrous core 150. Ferrous core 150 presents negligible impedance to lower frequencies utilized by data signals. When properly selected and implemented, ferrous core 150 provides significant impedance to noise, providing noise reduction while remaining "transparent" to normal circuit signal frequencies on circuit traces in circuit board region 290. For high frequency applications, ferrous core 150 can be viewed as a "frequency dependent resistor." Ferrous core 150 is magnetic and exhibits significant and useful loss for frequencies over 100 MHz.

Purely reactive inductors and capacitors can create detrimental configurations which induce circuit resonances and establish additional interferences. Most importantly, ferrous core 150 dampens unintended high frequency oscillations without creating resonant responses. The frequency dependent loss arises from the loss of energy incurred as a result of oscillation of microscopic magnetic regions called "domains" within ferrous core 150.

It is well known in the art that the performance of any magnetic material will be degraded if it is operated under a large DC bias or low frequency AC bias conditions. In a high current bias condition, ferrous core 150 would be absorbing all of the energy which it is capable of. Under "small" bias conditions, increasing the applied magnetomotive force or current through the center of ferrous core 150, induces a corresponding increase in magnetic flux. At some value of magnetomotive force or current, the magnetic flux stops increasing. Magnetomotive force beyond this value results in a rapid decrease in the permeability or capacity of the magnetic material to impede noise. For this condition, magnetic theory terms ferrous core 150 as saturated. When ferrous core 150 is saturated, it is unable to support further increases in magnetic flux and increasing magnetomotive force input. When ferrous core 150 experiences a large DC magnetizing force, due to a large current, ferrous core 150 will operate in its saturation region. The desirable lossy characteristics which creates noise suppression is greatly diminished when ferrous core 150 is operated in its saturation region.

In other words, ferrous core 150 will provide little noise attenuation if operated near or in its saturation region. When operated at DC bias currents greater than zero but less than the saturation bias value, ferrous core 150 will maintain a large lossy impedance and suppress interference. Since the present invention depends on the lossy component of the impedance of ferrous core 150, it is important to keep the net current through ferrous core 150 within specified tolerances. The net current through the ferrous core 150 can be described as the total current flowing in one direction minus the total current flowing in the opposite direction. A preferred embodiment of the present invention places substantially all of the power and ground transmission lines supplying circuit board 200 in circuit board region 290. For optimum performance, the current which flows through the center of ferrous core 150 on the power traces of circuit board 200 is substantially equivalent to the current which returns on ground traces of circuit board 200. In a preferred embodiment, all of the traces which constitute the power system of circuit board 200, i.e., the power and power return traces, all flow through the center of ferrous core 150. This ensures that the net current through ferrous core 150 does not operate ferrous core 150 in its saturation region.

In an additional embodiment, the power system of circuit board 200 might be separated into distinct regions or voltages and utilize multiple ferrous core 150. In this embodiment, a region or a voltage subsystem must route all of the power and corresponding ground traces through the same ferrous core 150 for maximum effectiveness. This keeps ferrous core 150 from operating in its saturation region. Since the current entering on power traces would be substantially equal to the current returning on the corresponding ground traces.

Referring to FIG. 3, ferrous core 150 raises the impedance of the common mode currents flowing from circuit board 200 to connector 210, thus reducing these undesirable currents. The placement of ferrous core 150 on circuit board 200 is unique in that it suppresses currents on all signal lines, power transmission lines and power planes flowing through circuit board region 290. Circuit board 200 must be specifically designed to accommodate this suppression system. That is signals, voltage planes and ground planes which are noise critical are routed through circuit board region 290 of FIG. 3 or as in FIG. 2 through the center of mounted ferrous core 150. Planes or copper layers carrying undesirable noise to and from connector 210 have a significant impedance to the undesirable frequencies. Placing ferrous core 150 closer to the source which is generating the noise, by placing ferrous core 150 on circuit board 200 is an improved solution to placing ferrous material on cabling. Minimal transmission line lengths radiate less noise because the noise is dissipated before the noise is allowed to radiate.

Apertures 220 and 222 on circuit board 200 allows simplified assembly of ferrous core 150 to circuit board 200. A ferrous core mounted on cables cause potential mechanical shock problems due to the weight of the ferrous core pulling on the cable or connector. The mounting of ferrous core 150 in the present invention allows circuit board 200 to support the weight of ferrous core 150 and does not require a cable to support the weight of ferrous core 150. Additionally, placing ferrous core 150 on circuit board 200 saves cabling costs.

Circuit board 200 has many components which require assembly. Affixing ferrous core 150 to circuit board 200 does not add significant cost because few additional assembly steps must be implemented. However, the savings in cabling expenditure is substantial.

High speed data bus interferences in computer systems may not allow the addition of an interconnecting cable for placement of a ferrous core. Impedance discontinuities and signal attenuation due to cabling and disconnects can be prohibitive in state of the art high speed systems. Therefore, the present invention will be more valuable as computer operating speeds increase.

Lightweight, inexpensive metal or polymer closure clamps 230 and 232 provide secure mounting of ferrous core 150 to circuit board 200. In a preferred embodiment, clamps 230 and 232 are secured by screws 250 and 260. However, many alternate securing means could be utilized without parting from the scope of the present invention.

In a preferred embodiment, a single pass through the center of ferrous core 150 is attained by each transmission line or trace. The impedance on transmission line noise due to ferrous core 150 may be substantially increased by two passes of a conductor or trace through area 130 of ferrous core 150 in FIG. 2.

The present invention attenuates high frequency interference near its source on circuit board 200. This strategy confines noise to the small regions on circuit board 200 and reduces the possibility that high frequency noise will radiate and couple to other sensitive circuits.

Attacking interference at the source provides a cost effective design approach. As a practical matter, filtering can only be located in a few specific locations. It is impractical to attempt to locally suppress every noisy circuit in an entire product. Effective source filtering also helps limit overall design costs by reducing the need for shielding by enclosure, which would otherwise be necessary to confine high frequency noise components.

Common mode noise is characterized by equal, in phase, high frequency currents that flow in the same direction along transmission lines such as those present in circuit board region 290. These currents induce a net magnetic field having a specific magnitude and direction. The present invention attenuates this noisy current by "capturing" the magnetic field and converting a portion of its energy into heat. Ferrous core 150 can be modeled as a two terminal electrical device presenting a large lossy impedance to the common mode current.

Customized cores may be required to accommodate different card dimensions or different frequency ranges. Ferrous core 150 on circuit board 200 provides filtering for all signals and power lines entering and leaving the circuit board on connector 210. The approximate in-circuit impedance of a specific core material for a given frequency can be determined by choosing the desired material composition.

As stated earlier, it is possible to further raise the impedance to common mode interference signals by routing the traces through area 130 of ferrous core 150 in FIG. 2 multiple times. Magnetic theory predicts that the impedance of the device will increase with the square of the number of turns. However, due to the lossy and non-linear nature of ferrous core 150 of the present invention, two turns will yield somewhat less than four times the impedance of an identical part wound with only one turn of conductor. Increasing the number of turns beyond two will tend to degrade performance at higher frequencies because interwinding capacitance dominates the characteristics of ferrous core 150.

Figure 4:
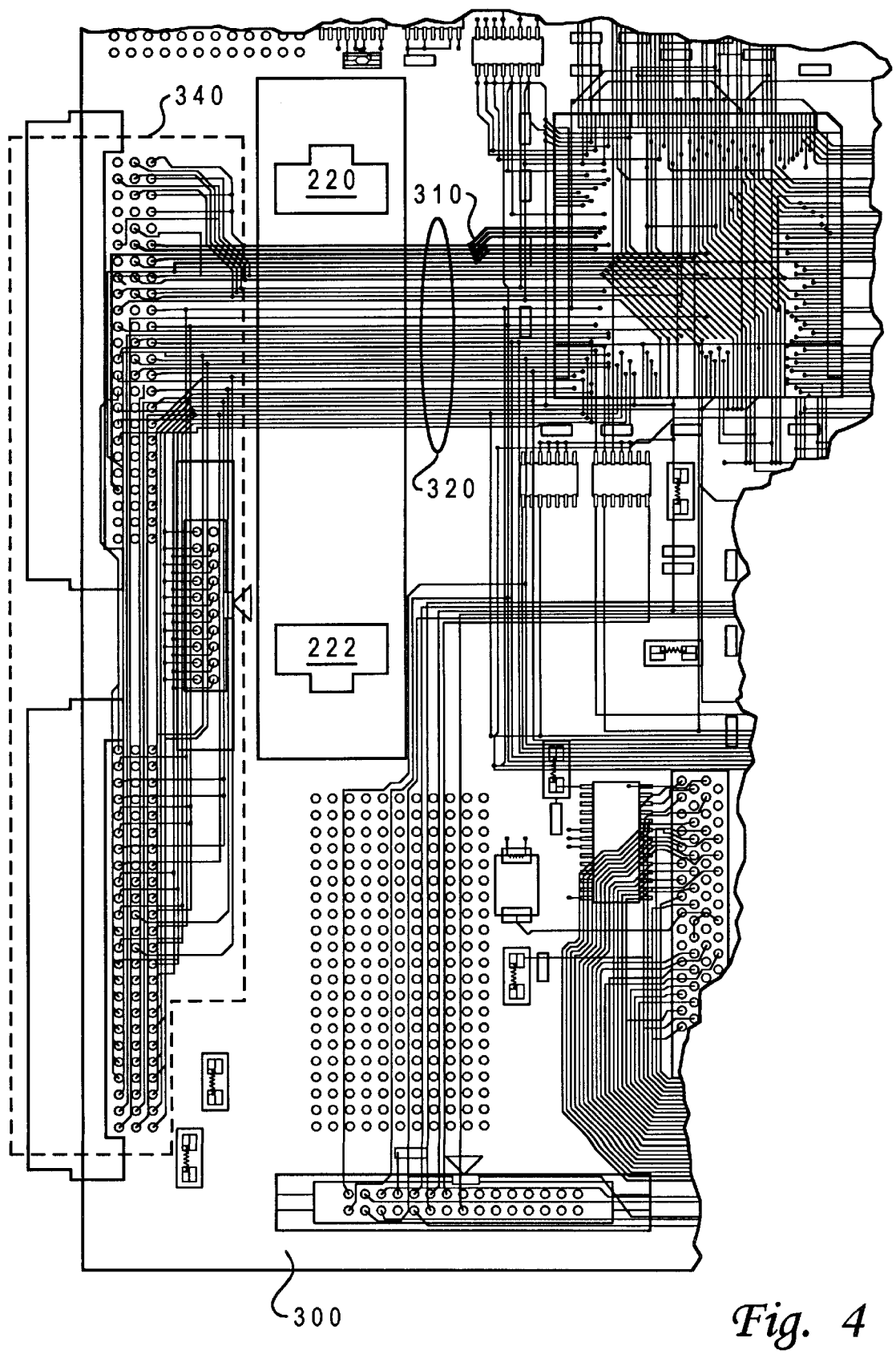
FIG. 4 depicts a cutaway view of a circuit board having a high density of transmission lines or traces which pass through the split ferrous core in accordance with the present invention.

FIG. 4 illustrates a cut away view of a circuit board 200. Apertures 220 and 222 are also illustrated in FIG. 4. In the area between apertures 220 and 222, multiple data traces such as 320 and multiple power traces such as 310 are illustrated. In general, power traces 310 have larger dimensions than data traces 320. The amount of current which a trace is required to conduct generally dictates the dimension of the trace. Dimensions of traces are determined during the design phase of circuit board 200. The larger the trace or the more cross sectional area of the trace, the more current it can carry without over heating.

Connector 210 of FIG. 3 provides an input and output port for circuit board 200. Connector 210 of FIG. 3 is inserted into the holes in circuit board 200 illustrated with dashed enclosure 340 of FIG. 4. The "foot print" of an input/output connector is illustrated within dashed enclosure 340. Connector 210 of FIG. 2, is inserted in the through-holes depicted in FIG. 4. In operation connector 210 provides a connection port having minimal noise. Substantially all of the traces which communicate with system components external to circuit board 200, are routed between apertures 220 and 222 such that ferrous core 150 can attenuate undesirable noise.

Routing all critical traces through circuit board region 290 of FIG. 3 or area 130 of ferrous core 150 in FIG. 2 allows ferrous core 150 to absorb the unwanted noise which is transmitted over power traces 310, data traces 320 and power planes in FIG. 4 to prevent interference on susceptible circuits.

Referring again to FIG. 2, basic current laws dictate that the same amount of current which flows into circuit board 200 also must flow out of circuit board 200. Hence, the present invention places substantially all of the current entering and exiting circuit board 200 in area 130 of ferrous core 150. Referring to FIG. 3, the net current following in circuit board region 290 between apertures 220 and 222 is substantially zero. Therefore, ferrous core 150 does not operate in its saturation region.

While the invention has been particularly shown and described with reference to a preferred embodiment, it will be understood by those skilled in the art that various changes in form and detail may be made therein without departing from the spirit and scope of the invention.

What is claimed is:

1. A noise attenuating system for suppressing noise on circuit board transmission lines, said noise attenuating system comprising:

a circuit board having a first side and a second side and at least one conductive transmission line;

a first ferrous member attached to said first side of said circuit board, wherein the ends of said first ferrous member protrude through a first and second aperture of said circuit board; and a second ferrous member attached to said second side of said circuit board and contacting said first ferrous member outside of said first and second apertures said second ferrous member substantially opposed from said first ferrous member, such that at least one conductive transmission line is at least partially disposed between said first ferrous member and said second ferrous member, wherein noise on said at least one conductive transmission line is absorbed and suppressed by said first ferrous member and said second ferrous member, said first ferrous member and said second ferrous member being fastened to said circuit board utilizing polymer retainers.

2. The system of claim 1, wherein substantially all traces which exit and enter said circuit board pass between said first ferrous member and said second ferrous member.

3. The system of claim 1, wherein said first ferrous member and said second ferrous member are constructed of a ferrite material.

4. The system of claim 1, wherein said circuit board has a first aperture and a second aperture wherein said first ferrous member and said second ferrous member contact each other in said first aperture and in said second aperture of said circuit board.

5. A noise attenuating system comprising:

a circuit board having a first side, a second side, at least one connector and a plurality of traces coupled to said connector;

a ferrite core comprised of a first ferrite member and second ferrite member, wherein:

said second ferrite member protrudes through a first and second aperture of said circuit board and contacts said first ferrite member outside of said first and second apertures;

said first ferrite member is attached to said first side of said circuit board adjacent to said at least one connector; and said second ferrite member is attached to said second side of said circuit board adjacent to said connector, said second ferrite member being substantially opposed from said first ferrite member, such that said plurality of traces coupled to said connector are partially disposed between said first ferrite member and said second ferrite member, wherein noise on said plurality of traces is absorbed and suppressed by said ferrite core such that said at least one connector provides a noise attenuated output, said first ferrite member and said second ferrite member being fastened to said circuit board utilizing polymer retainers.

6. The system of claim 5, wherein substantially all of said traces which exit and enter said circuit board through said connector pass between said first ferrite member and said second ferrite member.

* * * * *